June 22, 1954 R. V. POUND 2,681,998

MICROWAVE OSCILLATOR FREQUENCY CONTROL SYSTEM

Filed April 30, 1946

INVENTOR
ROBERT V. POUND
BY
William D. Hall
ATTORNEY

Patented June 22, 1954

2,681,998

UNITED STATES PATENT OFFICE 2,681,998

MICROWAVE OSCILLATOR FREQUENCY CONTROL SYSTEM

Robert V. Pound, Cambridge, Mass., assignor, by mesne assignments, to the United States of America as represented by the Secretary of War Application April 30, 1946, Serial No. 665,994

19 Claims. (Cl. 250—36)

This invention relates in general to electrical apparatus and more particularly to communication systems involving the use of automatic frequency control or frequency stabilization.

In the most common frequency modulated communication systems, the transmitting oscillator used has a relatively low frequency and low power output. The high carrier frequency, and high power output required for transmission are obtained by a series of multipliers and power amplifiers. The oscillator is frequency modulated by a modulating signal applied through a reactance tube. Frequency stabilization is obtained by use of a crystal oscillator monitor whose output is combined with a transmitting oscillator output in such a manner that the resultant signal, when passed through a conventional discriminator to the reactance tube, varies the oscillator to compensate for the frequency drift.

Such a system is disadvantageous in that a comparatively low radio frequency and low power oscillator must be used to permit modulation by a reactance tube. Further, the frequency stabilization acts slowly so that while an average frequency is maintained, rapid frequency variations, due to the modulation signal, must be allowed, and thus no stabilization is provided for modulation frequencies or rapid changes in carrier frequency. It is also impractical to use the many frequency multipliers and amplifiers necessary when a desired transmitting frequency is in a microwave range.

It is an object of this invention to provide a frequency stabilized oscillator.

Another object of the present invention is to provide frequency modulation in a microwave oscillator, with stabilization acting throughout the modulation frequency period.

It is a further object of the present invention to provide a stabilization system free from noise effects of crystals at low frequencies.

For a better understanding of the invention, together with other and further objects thereof, reference is had to the following description, taken in connection with the accompanying drawing, in which.

In the embodiment chosen to illustrate my invention, an oscillator is locked-in or controlled in frequency by voltage from a mixer, accordingly called a lock-in mixer. The output of the lock-in mixer is made to depend on the output of an I. F. oscillator and an I. F. amplifier. The latter is frequency sensitive to the output of the oscillator, as will appear more fully hereinafter.

Figure 1:
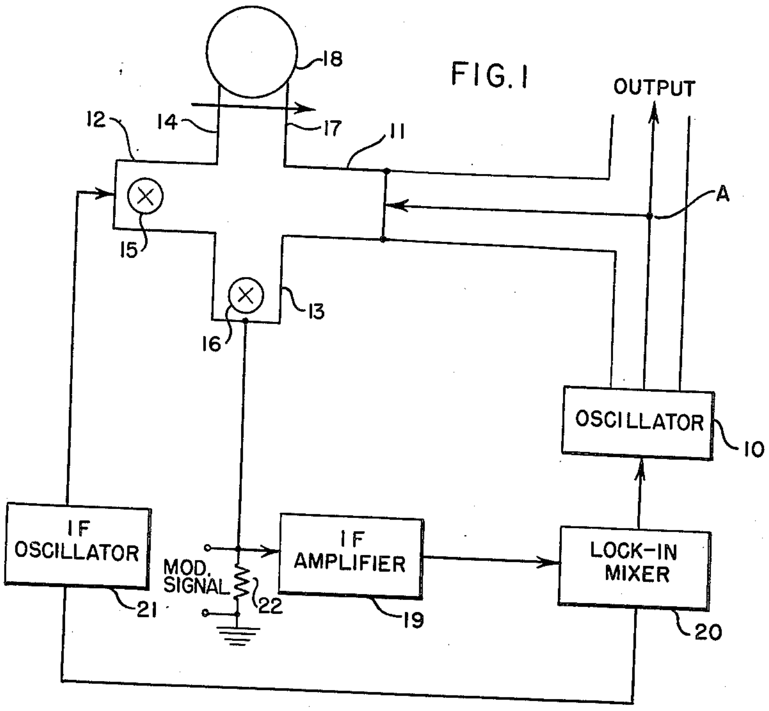
Fig. 1 is a block diagram showing an embodiment of the invention.

With reference to Fig. 1, there is shown a microwave oscillator 10 whose frequency is stabilized by associated apparatus. A portion of the signal output of oscillator 10 is extracted from the ouput circuit at a point A and coupled into one of the asymmetrical branches, branch 11, of a magic-T waveguide bridge, such as is disclosed and claimed in the copending application of Robert H. Dicke, Serial No. 581,695, filed March 8, 1945. The other asymmetrical branch 12 is terminated by a modulating crystal 15. One symmetrical branch 13 is terminated by a matched mixer crystal 16, and the other symmetrical branch 14 is terminated by a resonant cavity 18 coupled to the branch by a line 17 of adjustable electrical length. As is well known, the four branches have a common junction. Branches 13 and 14 are in alignment, and branches 11 and 12 are perpendicular to each other and to branches 13 and 14. The output of mixer crystal 16 is extracted and coupled back to the frequency control means of oscillator 10 through an amplifier 19 and a lock-in mixer 20.

The output of an I. F. oscillator 21 is coupled to a modulating crystal 15. The crystal 16 in symmetrical branch 13 is coupled to I. F. amplifier 19 which has a suitable band-pass characteristic. The frequency band passed by I. F. amplifier 19 may be quite narrow and is substantially the same as the frequency of operation of oscillator 21. Oscillator 21 and amplifier 19 have their outputs coupled to lock-in mixer 20. The resistor 22 provides a means for introducing a modulating signal which will result in frequency modulation of oscillator 10, as will appear more fully hereinafter.

The manner in which the output voltage of lock-in mixer 20 controls the frequency of oscillator 10 will depend upon its type and the range over which frequency control is desired. If, for example, an oscillator of the reflex klystron type is used, it may be tuned over a relatively narrow band of frequencies by applying the output of lock-in mixer 20 directly to the reflector voltage electrode. On the other hand, if a wider range of frequency control is desired, the output of lock-in mixer 20 may be applied to a thermal element by means of which the grid spacing of oscillator 10 may be varied.

Figure 2:
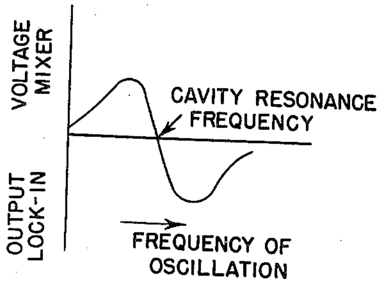
Fig. 2 is an idealized curve showing lock-in mixer voltage output with respect to frequency change of the oscillator.

Basically, the circuit described measures the imaginary part of the reflection coefficient at the cavity 18 and produces a D.-C. voltage proportional to it at the output of lock-in mixer 20 which is used as the error voltage applied to the frequency control element of oscillator 10. The operation of the circuit may be described as follows:

The signal from microwave oscillator 10 arriving at the magic-T through branch 11 splits into two parts and travels to mixer crystal 16 and to the resonant cavity 18 on the opposite arm. Mixer crystal 16 is matched so that there is no reflection but there will, in general, be a wave reflected from the cavity 18. This reflected wave is returned to the common junction of the magic-T where it is split into two parts, one of which goes back out the input branch 11 and may be dissipated in an attenuator therein (the percentage coupling between A and 11 is contemplated small in any event) and the other of which goes to modulator crystal 15 in branch 12. Crystal 15 is so mounted that if its I. F. terminals are short-circuited it is matched, and causes no reflection of incident energy. Under this condition of mounting the application of a large I. F. voltage to the terminals causes it to reflect during the presence of voltage across its terminals in approximately opposite phase for opposite polarities of instantaneous voltage. That is to say, the R. F. impedance is modulated approximately symmetrically at the I. F. frequency. This is equivalent to the generation of two side bands, one at R. F.+I. F. and the other at R. F.—I. F. frequencies. The instantaneous R. F. phase of these two side bands is determined by the phase of incident R. F. waves from which they are generated. They travel back to the magic-T junction where they are split, one part of each travelling to mixer crystal 16, and the other part to the resonant cavity 18. The part which goes back to the cavity will be at least partially affected by it and will again enter the magic-T and thence travel into the attenuator and be lost, and into modulator crystal 15 where two more side bands will be generated by each. Substantially none of the original side bands will be reflected because of the fact that the mixer crystal 16 is nearly matched at those frequencies. The two first order side bands which arrive at mixer crystal 16 will mix with the original signal arriving from microwave oscillator 10 and produce an incident wave at the crystal which contains in general both amplitude and phase modulation components at the I. F. frequency and higher harmonics. The frequency components other than those at I. F. frequency will not affect I. F. amplifier 19. The adjustable line 17 in the cavity arm of the magic-T is set in such a position that the amplitude modulation component at I. F. is proportional to the imaginary part of the reflection coefficient of the cavity, and a reversal in sign of this reflection coefficient corresponds to a reversal in phase of the modulation component. Crystal 16 detects this amplitude modulation component and there will be an I. F. voltage applied to the I. F. amplifier 19 which is proportional to the imaginary part of the reflection coefficient of resonant cavity 18. Thus, the output of amplifier 19 is likewise proportioned, and mixed, in the lock-in mixer 20 with a signal from the I. F. oscillator 21. This mixer produces a D. C. voltage proportional to the constant term of the Fourier expansion of A sin (wt.) sin (wt.+$\phi$) where $w$ is the angular I. F. frequency and $\phi$ is the relative phase between the signal from the I. F. oscillator 21 and the signal from the I. F. amplifier 19. This term is A/2 cos $\phi$. If $\phi$ is made to be zero, a positive voltage proportional to A results, but if the signal in the receiver is reversed in phase by reversal in sign of the imaginary part of the reflection coefficient from cavity 18, a negative voltage proportional to A results. Thus there is produced an error voltage as shown in idealized form in Fig. 2 when line 17 is adjusted to an optimum length. As the frequency of the oscillator shifts, the phase of reflection from the cavity is altered. The resultant error signal from the lock-in mixer, as shown in Fig. 2, automaticaly acts to control the frequency output and correct for any drifts from the desired standard. A modulation signal impressed across resistor 22 acts to change the bias on mixer crystal 16, which in turn varies the R. F. impedance of the crystal. As the crystal impedance is varied its reflectivity is correspondingly varied. The wave reflected by crystal 16 returns, in part, to crystal 15 and becomes converted to sideband signals, and a portion of these sideband signals are then impressed on mixer crystal 16, thereby producing in the output of mixer crystal 16 a modulated I. F. signal, which when applied through I. F. amplifier 19 and lock-in mixer 20 to the frequency control element of oscillator 10 produces stabilized frequency modulation of the oscillator.

It will be obvious to those skilled in the art that many variations and modifications may be made in the invention. Therefore, it is the purpose of the appended claims to include all such variations as fall within the scope and spirit of the invention.

I claim:

1. In a communication system including a microwave oscillator having at least an output means and a frequency controlling element, means for stabilizing the frequency of said oscillator comprising a magic-T bridge having first, second, third and fourth branches, coupling means coupling a portion of the output of said microwave oscillator into said first branch, a cavity resonator, an adjustable line interposed between said cavity resonator and the terminal of said second branch, a modulator crystal having a variable impedance and terminating said third branch, a mixer crystal matched to said magic-T bridge terminating said fourth branch, an intermediate frequency amplifier coupled to the output of said mixer crystal, a mixer interposed between the output of said intermediate frequency amplifier and said frequency controlling element, and an intermediate frequency oscillator having a portion of its output coupled to said modulator crystal and another portion coupled into said mixer, whereby an error voltage at the output of said mixer and indicative of the frequency deviation of said microwave oscillator controls the frequency of said microwave oscillator.

2. In a communication system including a microwave oscillator having at least an output means and a frequency controlling element, means for stabilizing the frequency of said oscillator comprising a magic-T bridge having first, second, third and fourth branches, coupling means coupling a portion of the output of said microwave oscillator into said first branch, a cavity resonator, an adjustable line interposed between said cavity resonator and said second branch, a modulator crystal having a variable impedance and terminating said third branch, a mixer crystal matched to said magic-T bridge terminating said fourth branch, means for impressing oscillations on said modulator crystal for varying the impedance of said modulator crystal at an intermediate frequency, means for combining the output of said mixer crystal with said oscillations to produce an output error voltage indicative of a frequency change in the output of said oscillator, and means for impressing said error voltage on said frequency controlling element whereby the said error voltage applied to said frequency controlling element causes said microwave oscillator to produce a stabilized output frequency.

3. In a communication system including a reflex klystron oscillator having at least an output means and a frequency controlling element, means for stabilizing the frequency of said oscillator comprising a waveguide T-bridge having first, second, third and fourth branches connected together at a common junction, said first and third branches being asymmetrical and said second and fourth branches being symmetrical and perpendicular to said first and third branches, coupling means coupling a portion of the output of said oscillator into said first branch, a cavity resonator, an adjustable line interposed between said cavity resonator and the terminal of said second branch, a modulator crystal having a variable impedance and terminating said third branch, a mixer crystal impedance-matched to said waveguide T-bridge terminating said fourth branch, an intermediate frequency amplifier coupled to the output of said mixer crystal, a mixer connected between the output of said intermediate frequency amplifier and said frequency controlling element, and an intermediate frequency oscillator having a portion of its output coupled to said modulator crystal and another portion coupled into said mixer, whereby an error voltage at the output of said mixer and indicative of the frequency deviation of said klystron oscillator controls the frequency of said klystron oscillator.

4. In combination, a reflex klystron oscillator having at least an output means and a frequency controlling element, means for stabilizing the frequency of said oscillator comprising a magic-T waveguide bridge having first, second, third and fourth branches connected together at a common junction, said first and third branches being asymmetrical and said second and fourth branches being symmetrical and perpendicular to said first and third branches, coupling means coupling a portion of the output of said oscillator into said first branch, a cavity resonator connected to the outer end of said second branch, a modulator crystal having a variable impedance and terminating said third branch, a mixer crystal impedance matched to said magic-T bridge terminating said fourth branch, an amplifier coupled to the output of said mixer crystal, a mixer connected between the output of said amplifier and said frequency controlling element, and an oscillator having a portion of its output coupled to said modulator crystal and another portion coupled into said mixer, whereby an error voltage at the output of said mixer and indicative of the frequency deviation of said klystron oscillator controls the frequency of said klystron oscillator.

5. The apparatus defined in claim 4, including means for modulating the output of said mixer crystal in response to a signal.

6. In combination, a microwave oscillator having at least an output means and a frequency controlling element, means for stabilizing the frequency of said oscillator comprising a magic-T bridge having first, second, third and fourth branches connected together at a common junction, said first and third branches being asymmetrical and said second and fourth branches being symmetrical and perpendicular to said first and third branches, coupling means coupling a portion of the output of said microwave oscillator into said first branch, a cavity resonator connected to the outer end of said second branch, a modulatable impedance in said third branch, a rectifier mounted in said fourth branch, a mixer connected between the output of said rectifier and said frequency controlling element, and an oscillator having a portion of its output coupled to said modulatable impedance and another portion coupled into said mixer, whereby an error voltage at the output of said mixer and indicative of the frequency deviation of said microwave oscillator controls the frequency of said microwave oscillator.

7. The apparatus defined in claim 6 including means for modulating the output of said mixer in response to a signal.

8. In combination a microwave oscillator having at least an output means and a frequency controlling element, means for stabilizing the frequency of said oscillator comprising a substantially balanced microwave bridge having first, second, third and fourth branches, coupling means for coupling a portion of the output of said microwave oscillator into said first branch, a cavity resonator coupled to said second branch, a modulatable impedance coupled to said third branch, a rectifier coupled to said fourth branch, a mixer connected between the output of said rectifier and said frequency controlling element, and an oscillator having a portion of its output coupled to said modulatable impedance and another portion coupled into said mixer, whereby an error voltage at the output of said mixer and indicative of the frequency deviation of said microwave oscillator controls the frequency of said microwave oscillator.

9. In combination, a source of carrier waves; means for deriving from said source a pair of wave components; means for amplitude modulating one of said components; means for combining the amplitude-modulated component and the other component to produce a resultant wave having a predetermined characteristic; means responsive to any shift in the frequency of said carrier wave for producing a change in said characteristic of said resultant wave; and means for deriving energy from said resultant wave having an amplitude which is a function of the extent of said change; and means responsive to said energy.

10. In combination, a source of carrier waves; first means for deriving from said wave source a pair of components; means for amplitude modulating one of said components; second means for combining the amplitude-modulated component and the other component to produce a resultant wave having a predetermined characteristic; means in said first means and responsive to any shift in the frequency of said carrier wave from a predetermined frequency for producing a change in said characteristic, the direction and magnitude of said change depending, repsectively, upon the direction and magnitude of said shift; means for deriving energy from said resultant wave having a magnitude and direction, which are respectively functions of the magnitude and direction of the change in said characteristic; and means responsive to said energy for reducing said shift in the frequency of said carrier wave.

11. The combination defined in claim 10, including means responsive to a signal for modulating the output of said energy deriving means.

12. Apparatus for stabilizing a carrier wave source at a predetermined frequency, comprising: first means for deriving from said wave source a pair of components; means including an oscillator for amplitude modulating one of said components; second means for combining the amplitude-modulated component and the other component to produce a resultant wave; a detector energized by said resultant wave; means in said first means and responsive to any drift in the frequency of said carrier wave from said predetermined frequency for producing a change in the output of said detector; means coupled to the outputs of said oscillator and said detector for deriving energy having an amplitude which is a function of the extent of said change; and means coupled to said source and responsive to said energy for reducing said frequency drift.

13. Apparatus for maintaining a fixed relationship between the frequency of a carrier wave and a selected reference frequency comprising: an energy-transmission system having a plurality of branches extending from a common junction; means for applying said carrier wave to a first of said branches; a tuned element, resonant to said selected reference frequency, terminating a second of said branches; means for amplitude modulating that portion of the carrier wave in one of said branches; means, terminating a third of said branches, for combining said amplitude-modulated portion and another portion of said carrier wave, to produce a resultant wave; means for recovering the modulation envelope of said resultant wave; and means receptive of said modulation envelope, for so tuning the source of said carrier wave as to maintain said fixed relationship between the frequency of said carrier wave and said selected reference frequency.

14. Apparatus for maintaining a fixed relationship between the frequency of a carrier wave and a selected reference frequency comprising: a wave guide having a plurality of branches extending from a common junction; means for applying said carrier wave to a first of said branches; a cavity resonator, resonant to said selected reference frequency, terminating a second of said branches; means including a source of modulation and a first nonlinear element energized thereby, for amplitude modulating that portion of said carrier wave in one of said branches; means terminating a third of said branches and including a second nonlinear element for combining said amplitude-modulated portion and another portion of said carrier wave and for recovering therefrom the modulation envelope; and means, receptive of said modulation envelope and the output of said source of modulation for so tuning the source of said carrier wave as to maintain said fixed relationship between the frequency of said carrier wave and said selected reference frequency.

15. Apparatus for stabilizing the frequency of a carrier wave, comprising: means for deriving a portion of said carrier wave; a tuned element having a resonant frequency with respect to which it is desired to maintain the frequency of said carrier wave in a fixed relationship, said tuned element being receptive of said carrier wave to produce a portion of said carrier wave whose phase and magnitude are functions, respectively, of the direction and magnitude of any deviation of the frequency thereof from that desired of said carrier wave; means for amplitude modulating one of said portions; means, receptive of said amplitude modulated portion of carrier wave and the other portion, for detecting the phase shift produced by said tuned element and deriving a unidirectional control voltage whose direction and magnitude are, likewise, functions of said frequency deviation; and means, receptive of said control voltage for tuning said carrier wave to compensate for any such frequency deviation.

16. In combination, a carrier wave source, means for deriving from said source a pair of components which are phase displaced relative to each other; means for amplitude modulating one of said components; means, including means for combining the amplitude-modulated component and the other component, to produce a resultant wave having a predetermined modulation characteristic; means responsive to any deviation in the frequency of said carrier wave from a predetermined frequency for altering the phase displacement of said components, whereby there is produced a departure in the modulation characteristic of said resultant wave from said predetermined characteristic; means for deriving energy from said resultant wave having an amplitude which is a function of the extent of said departure; and means responsive to said energy for reducing said frequency deviation.

17. Apparatus for stabilizing the frequency of a carrier wave comprising: means for amplitude modulating a portion of said carrier wave, a tuned circuit having a resonant frequency with respect to which it is desired to maintain the frequency of said carrier wave in a fixed relationship, said tuned circuit being receptive of another portion of said carrier wave to produce a reflected wave whose phase and magnitude are functions, respectively, of the direction and magnitude of any deviation of the frequency thereof from that desired of said carrier wave; means, receptive of said amplitude modulated portion of said carrier wave and said reflected wave, for detecting the phase of said reflected wave and deriving a unidirectional control voltage whose direction and magnitude are, likewise, functions of said frequency deviation; and means, receptive of said control voltage for tuning the source of said carrier wave to compensate for any such frequency deviation.

18. Apparatus for stabilizing the frequency of a carrier wave comprising: means for amplitude modulating a portion of said carrier wave, a cavity resonator having a resonant frequency with respect to which it is desired to maintain the frequency of said carrier wave in a fixed relationship, said cavity resonator being receptive of another portion of said carrier wave to produce a reflected wave whose phase and magnitude are functions, respectively, of the direction and magnitude of any deviation of the frequency thereof from that desired of said carrier wave; means, receptive of said amplitude modulated portion of said carrier wave and said reflected wave, for detecting the phase of said reflected wave and deriving a unidirectional control voltage whose direction and magnitude are, likewise, functions of said frequency deviation; and means, receptive of said control voltage for tuning the source of said carrier wave to compensate for any such frequency deviation.

19. Frequency-stabilizing apparatus comprising: a source of relatively high-frequency oscillations; a source of relatively low-frequency oscillations; a circuit, receptive of said relatively high and low-frequency oscillations, and including a cavity resonator having a resonant frequency with respect to which it is desired to maintain the frequency of said high-frequency oscillations in a fixed relationship, for modulating said high-frequency oscillations with said low-frequency oscillations to produce a modulated wave the phase and magnitude of whose modulation envelope are functions, respectively, of the direction and magnitude of any deviation of the frequency of said high-frequency oscillations from that desired thereof; means, receptive of said modulated wave, for recovering said modulation envelope; means, receptive of said modulation envelope and a portion of the output of said source of relatively low-frequency oscillations, for comparing the phases thereof and deriving therefrom a unidirectional control voltage whose direction and magnitude are, likewise, functions of said frequency deviation; and means, receptive of said control voltage and coupled to said source of relatively high-frequency oscillations, for tuning said source of relatively high-frequency oscillations to compensate for any such frequency deviation.

References Cited in the file of this patent

UNITED STATES PATENTS

| Number | Name | Date |
| --- | --- | --- |
| 2,425,013 | Stotz | Aug. 5, 1947 |
| 2,425,657 | Tunick | Aug. 12, 1947 |
| 2,486,001 | Bruck et al. | Oct. 25, 1949 |